United States Patent
Wei et al.

(10) Patent No.: US 10,122,526 B2
(45) Date of Patent: Nov. 6, 2018

(54) PHASE DETECTOR IN A DELAY LOCKED LOOP

(71) Applicant: Intel Corporation, Santa Clara, CA (US)

(72) Inventors: Fangxing Wei, Folsom, CA (US); Dan Shi, Folsom, CA (US); Michael J. Allen, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/477,078

(22) Filed: Apr. 1, 2017

(65) Prior Publication Data

US 2018/0287774 A1    Oct. 4, 2018

(51) Int. Cl.
*H04L 7/033* (2006.01)
*H04L 7/027* (2006.01)
*H04L 7/04* (2006.01)
*H03L 7/087* (2006.01)
*H04L 7/00* (2006.01)

(52) U.S. Cl.
CPC ............ *H04L 7/0331* (2013.01); *H03L 7/087* (2013.01); *H04L 7/0037* (2013.01); *H04L 7/0045* (2013.01); *H04L 7/027* (2013.01); *H04L 7/04* (2013.01)

(58) Field of Classification Search
CPC ... H04L 7/0331; H04L 7/0037; H04L 7/0045; H04L 7/027; H04L 7/04; H03L 7/087
See application file for complete search history.

(56) References Cited

U.S. PATENT DOCUMENTS

| | | | |
|---|---|---|---|
| 3,646,455 A | 2/1972 | Coccagna | |
| 6,617,900 B1 | 9/2003 | Blair | |
| 6,642,747 B1 * | 11/2003 | Chiu | H03D 13/004 327/40 |
| 7,646,224 B2 * | 1/2010 | Sundby | H03K 5/19 327/147 |
| 8,390,347 B1 * | 3/2013 | Sinha | H03L 7/085 327/147 |
| 2002/0034274 A1 * | 3/2002 | Yabe | H03D 13/004 375/376 |
| 2008/0130396 A1 | 6/2008 | Gomm et al. | |

OTHER PUBLICATIONS

International Search Report dated Jun. 21, 2018, in International Application No. PCT/US2018/020545, filed Mar. 1, 2018; 13 pages.

* cited by examiner

*Primary Examiner* — Janice N Tieu
(74) *Attorney, Agent, or Firm* — Thorpe North & Western, LLP; David W. Osborne

(57) ABSTRACT

Technology for a phase detector is described. The phase detector can include a reference clock. The phase detector can include a feedback clock. The phase detector can include a first latch operable to set a first latch output depending on a lead-lag status between the reference clock and the feedback clock. The phase detector can include a second latch that loads the lead-lag status when the reference clock and the feedback clock produce clock signals in a high state. The phase detector can include a third latch that loads the lead-lag status from the second latch when the reference clock and the feedback clock produce clock signals in a low state.

23 Claims, 11 Drawing Sheets

PHASE DETECTOR IN A DELAY LOCKED LOOP

BACKGROUND

Delay locked loops (DLLs) are widely employed in microprocessors, memory, and communication integrated circuits to reduce chip clock buffering delays and improve input-output timing margins. DLLs can include a voltage-controlled delay line (VCDL), a phase detector and a charge pump. DLLs can function to achieve phase alignment between an input clock and an output clock from a final stage of the VCDL. After the phase alignment is achieved, each VCDL delay stage can provide a stable clock signal which is phase shifted from an input clock in the phase detector.

In a DLL, an input clock signal can propagate through the VCDL and develop phase shift (or time delay) at each delay stage of the VCDL. The phase shift of each delay stage can be controlled by a voltage of a loop filter. An output can be taken from one of the delay stages. A phase of an output signal can be compared with a phase of the input clock in the phase detector. The phase detector can generate phase error information, which can be transferred to the charge pump. The charge pump can use the phase error information to adjust the voltage of the loop filter, and thus to change the phase shift (or time delay) of the VCDL. A phase shift (or time delay) error can be gradually reduced to zero. At that time, the phase shift (or time delay) of the whole VCDL line can become equal to one clock period and the voltage of the loop filter can be stabilized, which can indicate that a locked state has been established.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein.

Figure 1:
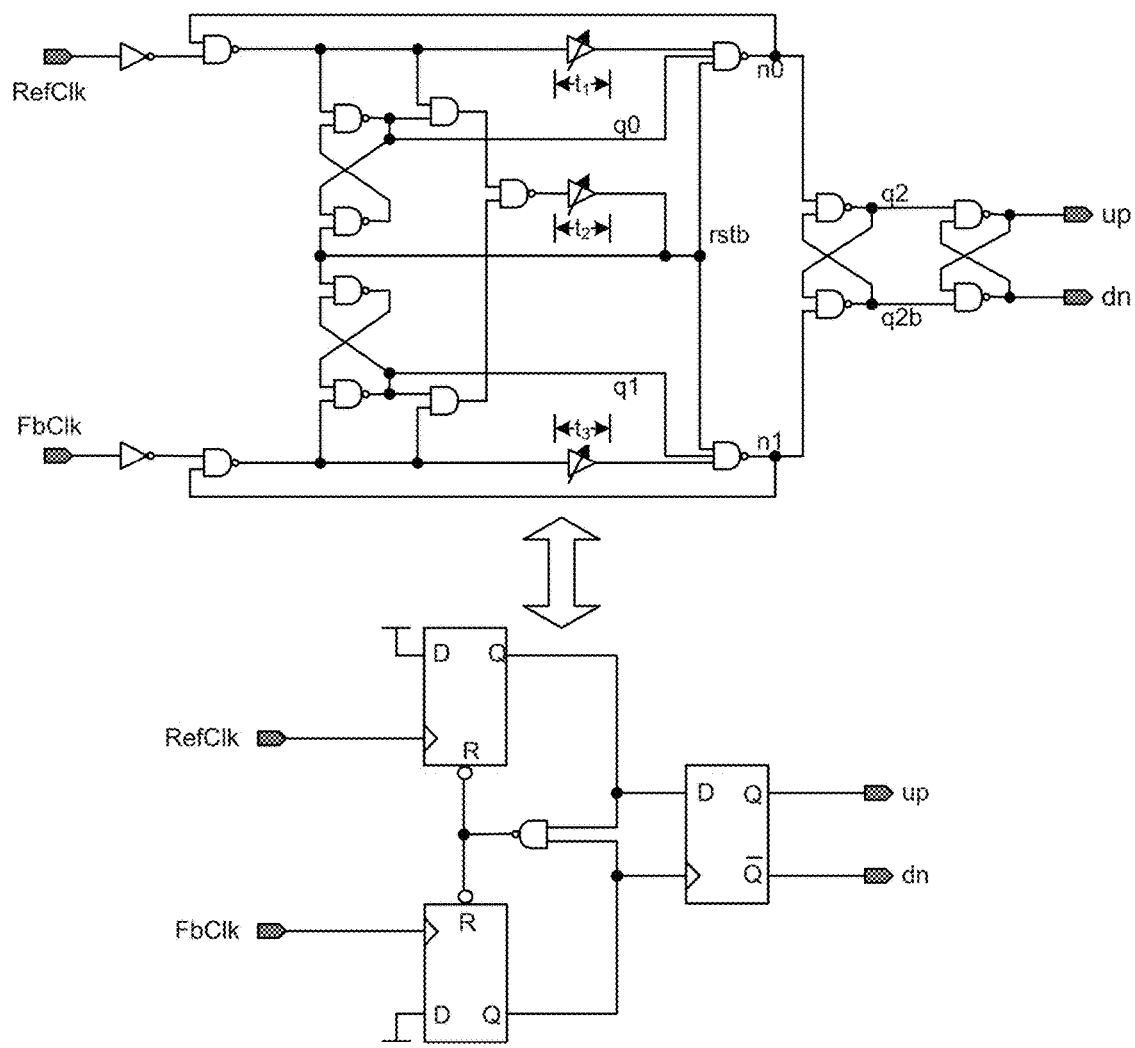
FIG. 1 illustrates a schematic of an example phase detector.

Reference will now be made to the embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

EXAMPLE EMBODIMENTS

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In one configuration, delay locked loops (DLLs) can be utilized to align data (DQ) and/or data strobe signals (DQS) at output pads to an external clock at an input clock pad. For a double data rate (DDR) output path, the DQ/DQS at the output pads can be clocked by the external clock from the input clock pad. A delay from the input clock pad to the DQ/DQS at the output pads can be controlled by an on-chip analog delay. In order to align the DQ/DQS at the output pads with the input clock pad, a DLL can be utilized to add some delay to an existing analog delay, such that a total delay is an integral number of an input clock period. Then, the DQ/DQS at the output pads can be aligned with the external clock at the input clock pad.

DLL designs can include a phase detector, which can be utilized for determining a difference in phase between two clock signal inputs. One clock signal can be referred to as a "reference", which represents the clock from the input pad, and the other clock signal can be referred to as a "feedback", which represents the clock from the DQ/DQS output pads. Phase detectors can be used to guide a DLL tuning direction. In other words, the phase detectors can be utilized to guide a DLL lock search. If the "feedback" clock edge at the phase detector input leads the "reference" clock edge at the phase detector input, the phase detector can output an "up" indication to add more delay in a DLL controlled delay chain. If the "feedback" clock edge at the phase detector input lags the "reference" clock edge at the phase detector input, the phase detector can output a "down" indication to reduce delay in the DLL controlled delay chain.

Traditional phase detector designs are subject to several weaknesses. For example, a bang-bang phase detector can cause a false lock when its reference clock and feedback clock are a 180 degree phase apart. In addition, the bang-bang phase detector can be prone to an increased level of noise. On the other hand, while a conventional phase detector can beneficially provide a counter-based DLL locking algorithm, the conventional phase detector can be positive edge triggered and subject to a tight delay matching or trimming requirement, and a failure to meet this matching or trimming requirement can cause DLL yield or timing issues.

In the present technology, a novel phase detector design or configuration for inclusion in a DLL design can be utilized to replace the traditional designs for the bang-bang phase detector and the conventional phase detector. The novel phase detector design can overcome the weaknesses of the bang-bang phase detector and the conventional phase detector, respectively. For example, the novel phase detector design can resolve the 180 degree false lock (or toggling) issue associated with the bang-bang phase detector. In addition, the novel phase detector design can resolve the internal delay matching/trimming issues associated with the conventional phase detector.

In the present technology, as explained in further detail below, the novel phase detector design can incorporate three cross coupled latches. To explain the phase detector operation, a clock high state indicates that the clock is at its high pulse, and a clock low state indicates that the clock is at its low pulse. A first cross coupled latch can be used to sense a lead/lag status between a DLL reference clock and a DLL feedback clock. The lead/lag status can indicate whether the DLL feedback clock is leading or lagging the DLL reference clock. If the reference clock transits to high state first, the feedback clock is noted as lagging the reference clock edge. If the feedback clock transits to high state first, the feedback clock is noted as leading the reference clock. When both the DLL reference clock and the DLL feedback clock transit to high states, the lead/lag status evaluation is done, and can be saved at the first cross coupled latch. At the same time, a width adjustable pulse can be generated from the two clock high states to open the second cross coupled latch temporarily to load the lead/lag status from first cross coupled latch to the second cross coupled latch. When both the DLL reference clock and the DLL feedback clock transit to low states, the first cross coupled latch can be reset to all low to get ready for the next lead/lag evaluation. At the same time, the reference clock and feedback clock all low states inside the first cross coupled latch can generate a pulse to open the third cross coupled latch to transfer the lead/lag status to phase detector outputs as an up/down indication for DLL delay adjustment. When the DLL reference clock and the DLL feedback clock have a 180 degree out-of-phase, there is no loading pulse to be generated for the second and third cross coupled latches, so the second and third cross coupled latches can be closed to updates to prevent incorrect toggling.

In one example, the digital delay locked loops (DLLs) can be employed in memory systems. The memory systems can include volatile memory (VM) and/or non-volatile memory (NVM). VM can include any type of VM, and is not considered to be limiting. VM is a storage medium that requires power to maintain the state of data stored by the medium. Non-limiting examples of volatile memory can include random access memory (RAM), such as static random access memory (SRAM), dynamic random-access memory (DRAM), synchronous dynamic random access memory (SDRAM), and the like, including combinations thereof. SDRAM memory can include any variant thereof, such as single data rate SDRAM (SDR DRAM), double data rate (DDR) SDRAM, including DDR, DDR2, DDR3, DDR4, DDR5. Also, low power DDR (LPDDR) SDRAM, including LPDDR, LPDDR2, LPDDR3, LPDDR4, and so on. In some examples, DRAM complies with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209B for LPDDR SDRAM, JESD209-2F for LPDDR2 SDRAM, JESD209-3C for LPDDR3 SDRAM, and JESD209-4A for LPDDR4 SDRAM (these standards are available at www.jedec.org; DDR5 SDRAM is forthcoming). Such standards (and similar standards) may be referred to as DDR-based or LPDDR-based standards, and communication interfaces that implement such standards may be referred to as DDR-based or LPDDR-based interfaces.

NVM is a persistent storage medium, or in other words, a storage medium that does not require power to maintain the state of data stored therein. Non-limiting examples of NVM can include planar or three-dimensional (3D) NAND flash memory, NOR flash memory, cross point array memory, including 3D cross point memory, phase change memory (PCM), such as chalcogenide PCM, non-volatile dual in-line memory module (NVDIMM), ferroelectric memory (FeRAM), silicon-oxide-nitride-oxide-silicon (SONOS) memory, polymer memory (e.g., ferroelectric polymer memory), ferroelectric transistor random access memory (Fe-TRAM), spin transfer torque (STT) memory, nanowire memory, electrically erasable programmable read-only memory (EEPROM), magnetoresistive random-access memory (MRAM), write in place non-volatile MRAM (NVMRAM), nanotube RAM (NRAM), and the like, including combinations thereof. NVM can be byte or block addressable. In some examples, non-volatile memory can comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org).

FIG. 1 illustrates an exemplary conventional phase detector. As shown, the conventional phase detector can be represented as a gate level implementation circuit and a logic equivalent. The conventional phase detector can include a reference clock (RefClk) and a feedback clock (FbClk). The conventional phase detector can include two self-timed flip-flops, which can convert a lead/lag status of the reference and feedback clocks into two lead/lag pulses. The lead/lag status of the reference and feedback clocks can be converted into the two lead/lag pulses at nodes "n0" and "n1", and the lead/lag pulses can be wide/narrow pulses at nodes "n0" and "n1". By matching/trimming three delay elements (e.g., "t1", "t2" and "t3"), a narrow pulse can be hidden. The "t2" trimming can be used to control the reset signal "rstb" pulse width to safely reset the phase detector for the next lead/lag evaluation after the current one is done. The "t1"/"t3" trimmings can be used to ensure that the narrow pulse can be just basely removed. If the "t1"/"t3" delay is too large, the narrow pulse can be removed; but an extra delay can become the phase detector's dead band. In addition, the conventional phase detector can include two sets of cross-coupled latches, which can convert the two lead/lag pulses into up and down logic control outputs.

In one example, when "RefClk" sets "q0" to high before "FbClk" sets "q1" to high, the "FbClk" is noted as lagging "RefCLk"; and the "dn" signal is set to high to reduce DLL delay. When "RefClk" sets "q0" to high after "FbClk" sets "q1" to high, the "FbClk" is noted as leading "RefClk"; and the "up" signal is set to high to add DLL delay. In one example, with respect to the conventional phase detector, a failure to meet matching/trimming requirements can cause a DLL yield or timing issues.

Figure 2:
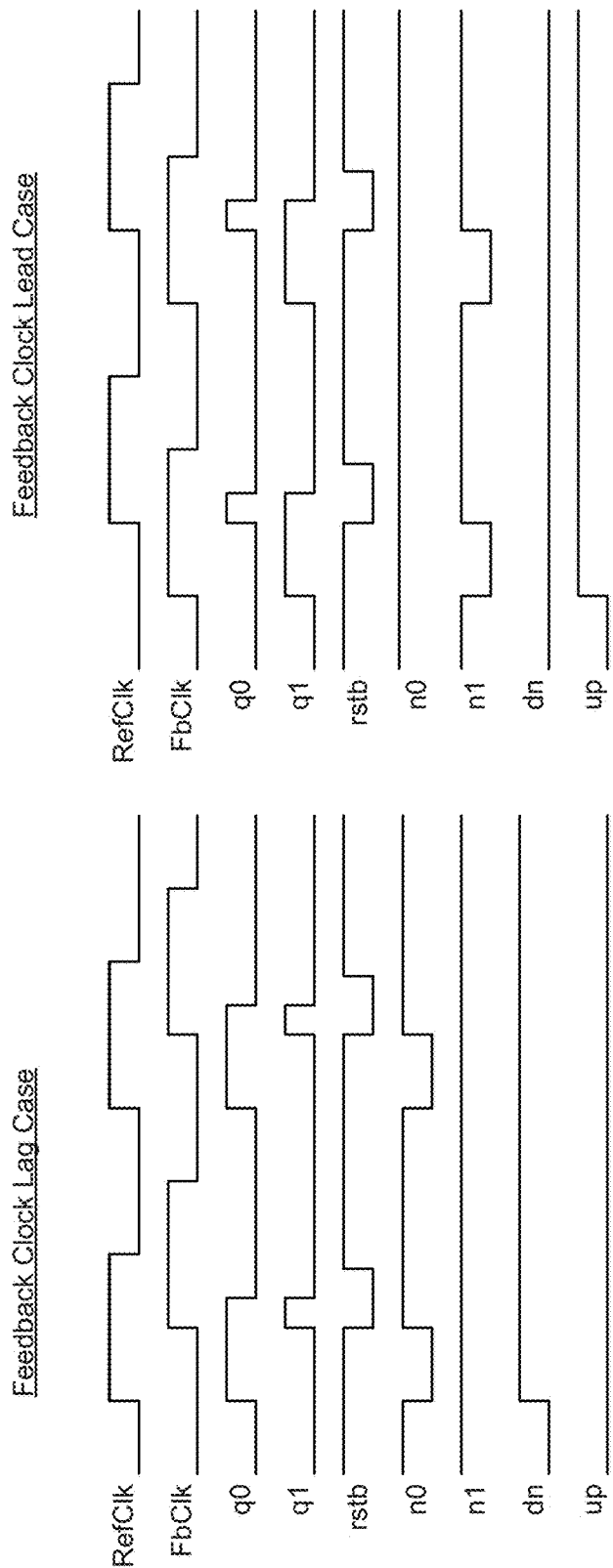
FIG. 2 illustrates operation waveforms for an example phase detector.

FIG. 2 illustrates exemplary operation waveforms for a conventional phase detector. The operation waveforms for the conventional phase detector can correspond to a feedback clock lag case (i.e., when a feedback clock in the conventional phase detector lags a reference clock in the conventional phase detector), and the operation waveforms for the conventional phase detector can correspond to a feedback clock lead case (i.e., when the feedback clock leads the reference clock). For both of the feedback lag/lead cases, the operation waveforms can be represented as square waves over a period of time. For the conventional phase detector, the operation waveforms can correspond to the reference clock (RefClk), the feedback clock (FbClk), a "q0" node, a "q1" node, a "rstb" node, a "n0" node, a "n1" node, a down logic control output, and an up logic control output.

Figure 3:
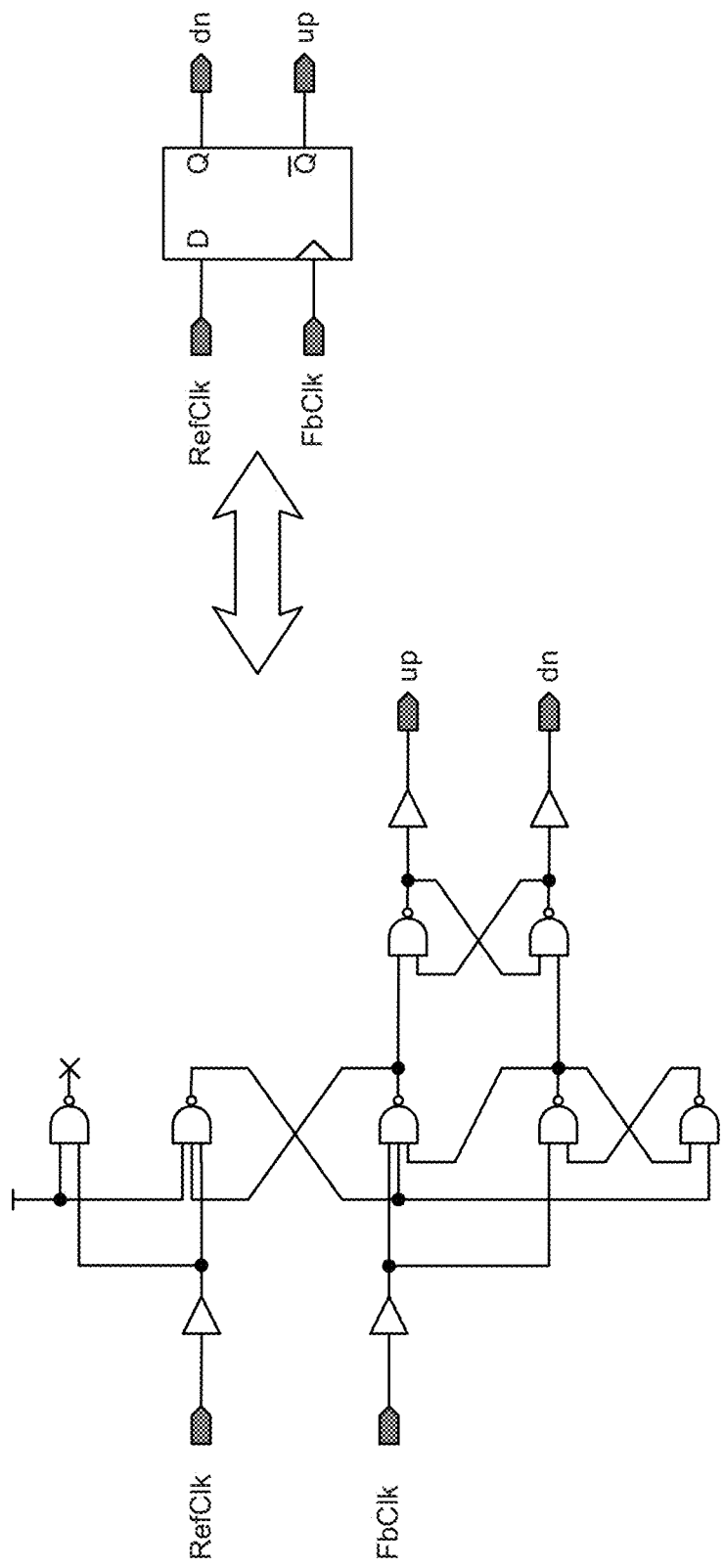
FIG. 3 illustrates a schematic of an example bang-bang phase detector.

FIG. 3 illustrates an exemplary bang-bang phase detector. As shown, the bang-bang phase detector can be represented as a gate level implementation circuit and a logic equivalent. The bang-bang phase detector can include a reference clock (RefClk) and a feedback clock (FbClk). The bang-bang phase detector can be equivalent to a D-flip-flop. The reference clock can correspond to a "D" input and the feedback clock can correspond to a clock input. The bang-bang phase detector can utilize the feedback clock to sample the reference clock. Based on the reference and feedback clocks as inputs, the bang-bang phase detector can produce up and down logic control outputs.

Figure 4:
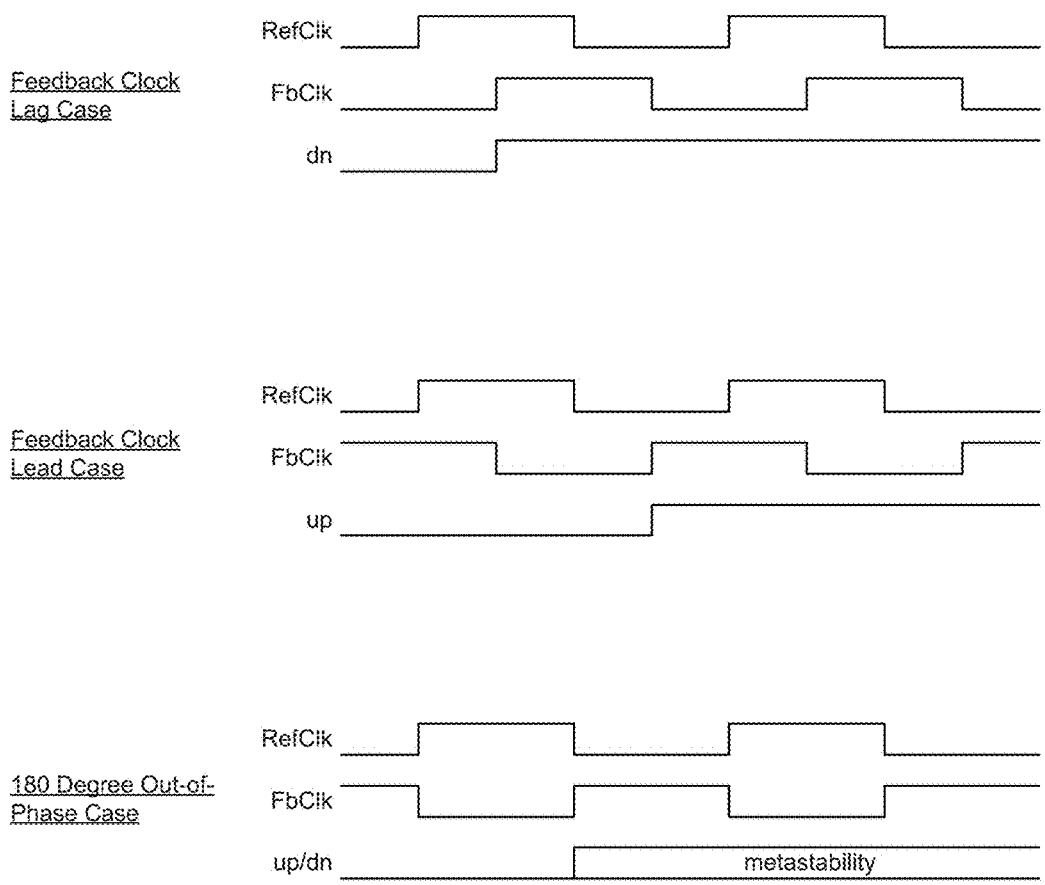
FIG. 4 illustrates operation waveforms for an example bang-bang phase detector.

FIG. 4 illustrates exemplary operation waveforms for a bang-bang phase detector. The operation waveforms for the bang-bang phase detector can correspond to: a feedback clock lag case (i.e., when a feedback clock in the bang-bang phase detector lags a reference clock in the bang-bang phase detector), a feedback clock lead case (i.e., when the feedback clock leads the reference clock), and a 180 degree out-of-phase case (i.e., when the feedback clock and the reference clock are 180 degrees out of phase). For all three cases, the operation waveforms can be represented as square waves over a period of time, and the operation waveforms can correspond to the reference clock (RefClk), the feedback clock (FbClk), and up/down logic control outputs. More specifically, for the feedback clock lag case, a down logic control output can transit to a high state over a period of time. For the feedback clock lead case, an up logic control output can transit to a high state over a period of time. For the 180 degree out-of-phase case, the up/down logic control outputs can be uncertain and can result in the bang-bang phase detector being in a metastability state. In one example, with respect to the bang-bang phase detector, a false lock can occur when the reference clock and the feedback clock are a 180 degree phase apart.

Figure 5:
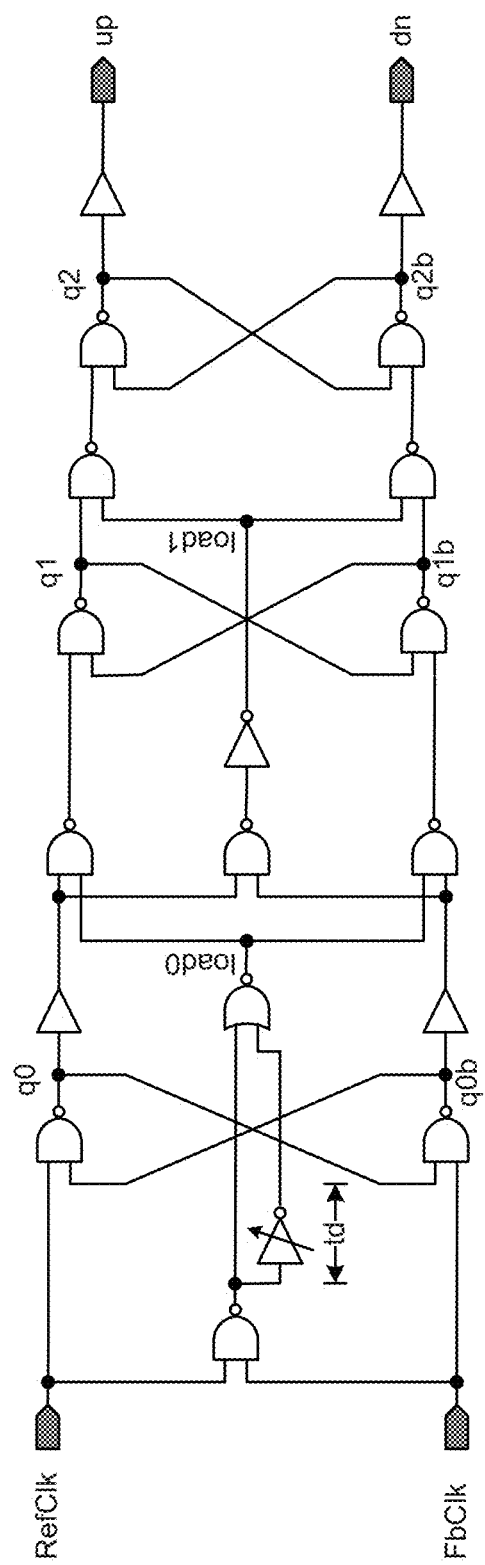
FIG. 5 illustrates a schematic of a phase detector in accordance with an example embodiment.

FIG. 5 illustrates an exemplary phase detector that overcomes weaknesses associated with a conventional phase detector and a bang-bang phase detector. As shown, the phase detector can be represented as a gate level implementation circuit. The phase detector can include a DLL reference clock (RefClk) and a DLL feedback clock (FbClk) as inputs, and the phase detector can produce up and down logic control outputs. The phase detector can include three cross coupled latches. A first cross coupled latch can be associated with a first latch output "q0", a second cross coupled latch can be associated with a second latch output "q1", and a third cross coupled latch can be associated with a third latch output "q2". In addition, the first, second and third cross coupled latches can be associated with latch outputs "q0b", "q1b" and "q2b", respectively.

In one example, the first cross coupled latch can be used to sense a lead/lag status between the DLL reference clock and the DLL feedback clock. The lead/lag status can indicate whether the DLL feedback clock is leading or lagging the DLL reference clock. When the DLL feedback clock leads the DLL reference clock, the first latch output "q0" can be set to a high state. Alternatively, when the DLL feedback clock lags the DLL reference clock, the first latch output "q0" can be set to a low state.

In another example, when both the DLL feedback clock and the DLL reference clock are at high states, a pulse signal "load0" is produced. The "load0" pulse positive transition can be triggered by the last high state transition from either the reference clock or the feedback clock. The "load0" pulse negative edge can be self-timed, and can be controlled by the trimming delay "td". In this example, "td" can be large enough to pass the lead/lag status from first latch to the second latch. If "td" is too large, this can affect the phase detector's top operation frequency. Alternatively, when both the DLL feedback clock and the DLL reference clock are at low states, the first latch outputs "q0"/"q0b" can all be set to high to get ready for the next lead/lag evaluation. At the same time, the "q0"/"q0b" high states can produce a "load1" pulse to load the lead/lag status from the second cross coupled latch into the third cross coupled latch.

In yet another example, when the DLL feedback clock and the DLL reference clock have a 180 degree out-of-phase, the pulse signals "load0" and "load1" may not go to a high state. Therefore, the second and third cross coupled latches can be isolated from updates to prevent incorrect toggling.

In one example, a self-timed pulse width for the pulse signal "load0" can be controlled by a series of gate delays or timing delays "td". In one example, a minimum of three gate delays or timing delays can be sufficient to pass the lead/lag state from the first cross coupled latch to the second cross coupled latch. In some cases, when the self-timed pulse width is too high, a top operation frequency of the phase detector can be limited.

In one configuration, with respect to a feedback clock lag case (i.e., when the DLL feedback clock in the phase detector lags the DLL reference clock in the phase detector), the first latch output "q0/q0b" can be set to a low (e.g., "01") state when the DLL reference clock transits from a low to high state. When both the DLL reference clock and the DLL feedback clock are at high states, the pulse signal "load0" (e.g., a self-timed high pulse) produced by the reference/feedback clock high states can load the first latch output "q0/q0b" of the low state into the second cross coupled latch, and the second latch output "q1/q1b" can be set to a low state. When both the DLL reference clock and the DLL feedback clock are at low states, the pulse signal "load1" produced by the first cross coupled latch "q0/q0b" at a "11" state can load the second latch output "q1/q1b" of the low state into the third cross coupled latch, and the third latch output "q2/q2b" can be set to a low state. Then, the phase detector can send a down output value of '1' to a DLL state machine to decrease a delay chain delay when the third latch output "q2/q2b" is set to the low state.

In another configuration, with respect to a feedback clock lead case (i.e., when the DLL feedback clock in the phase detector leads the DLL reference clock in the phase detector), the first latch output "q0/q0b" can be set to a high (e.g., "10") state when the DLL feedback clock transits from a low to high state. When both the DLL reference clock and the DLL feedback clock are at high states, the pulse signal "load0" (e.g., a self-timed high pulse) produced by the reference/feedback clock high states can load the first latch output "q0/q0b" of high (e.g., the "10" state) into the second cross coupled latch, and the second latch output "q1/q1b" can be set to a high state. When both the DLL reference clock and the DLL feedback clock are at low states, the pulse signal "load1" produced by the first cross coupled latch "q0/q0b" at a "11" state can load the second latch output "q1/q1b" of the high state into the third cross coupled latch, and the third latch output "q2/q2b" can be set to a high state. Then, the phase detector can send an up output value of '1' to a DLL state machine to increase a delay chain delay when the third latch output "q2/q2b" is set to the high state.

Figure 6:
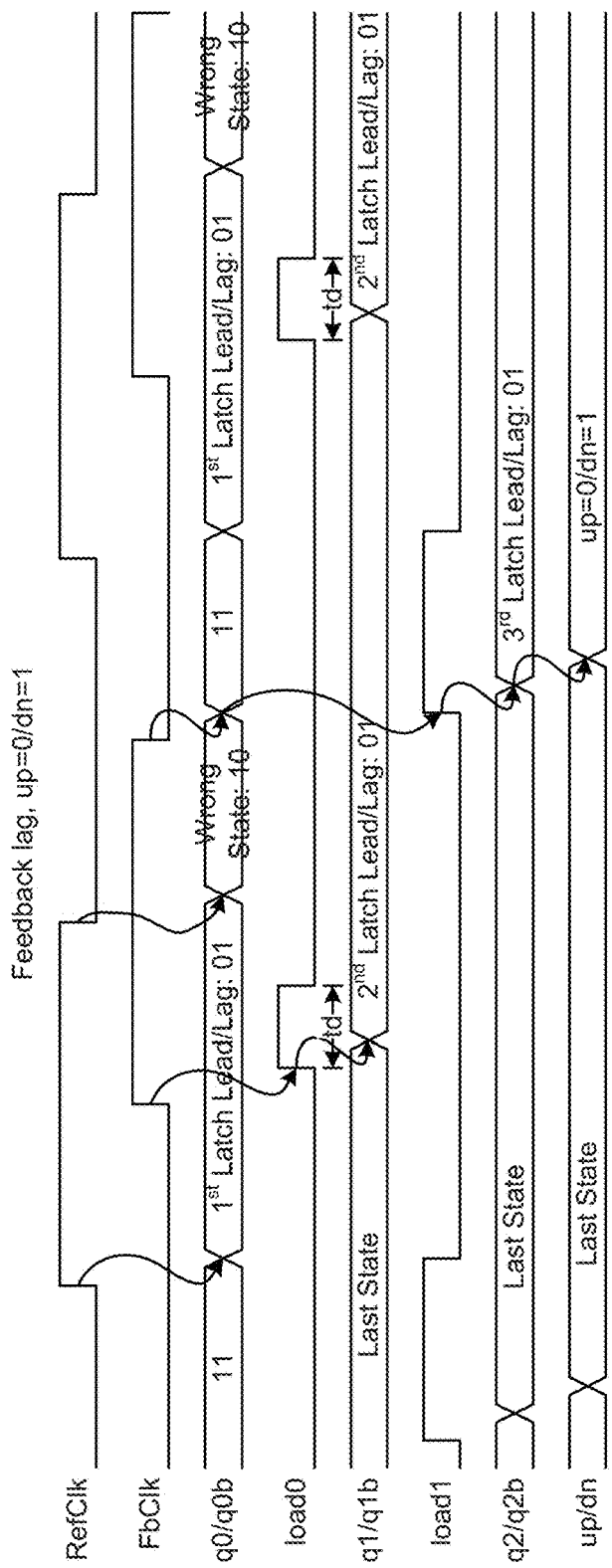
FIG. 6 illustrates feedback lag waveforms for a phase detector in accordance with an example embodiment.

FIG. 6 illustrates exemplary feedback lag waveforms for a novel phase detector. The feedback lag waveforms can be applicable for a feedback clock lag case, in which a DLL feedback clock (FbClk) in the phase detector lags a DLL reference clock (RefClk) in the phase detector. The feedback lag waveforms can correspond to the DLL feedback clock, the DLL reference clock, a pulse signal "load0" produced by both the reference clock and feedback clock at high states, and a pulse signal "load1" produced by the first cross coupled latch "q0/q0b" at a "11" state when both the reference clock and feedback clock are at low states in the phase detector.

As shown, a first latch output "q0/q0b" of the first cross coupled latch can be set to a low (e.g., "01") state when the DLL reference clock transits from a low to high state. When both the DLL reference clock and the DLL feedback clock are at high states, a pulse signal "load0" can load the first latch output "q0/q0b" of the low state into the second cross coupled latch, and a second latch output "q1/q1b" can be set to a low state. When both the DLL reference clock and the DLL feedback clock are at low states, the pulse signal "load1" can load the second latch output "q1/q1b" of the low state into a third cross coupled latch, and a third latch output "q2/q2b" can be set to a low state. Then, a down output value of '1' can be sent to a DLL state machine to decrease a delay chain delay when the third latch output "q2/q2b" is set to the low state.

Figure 7:
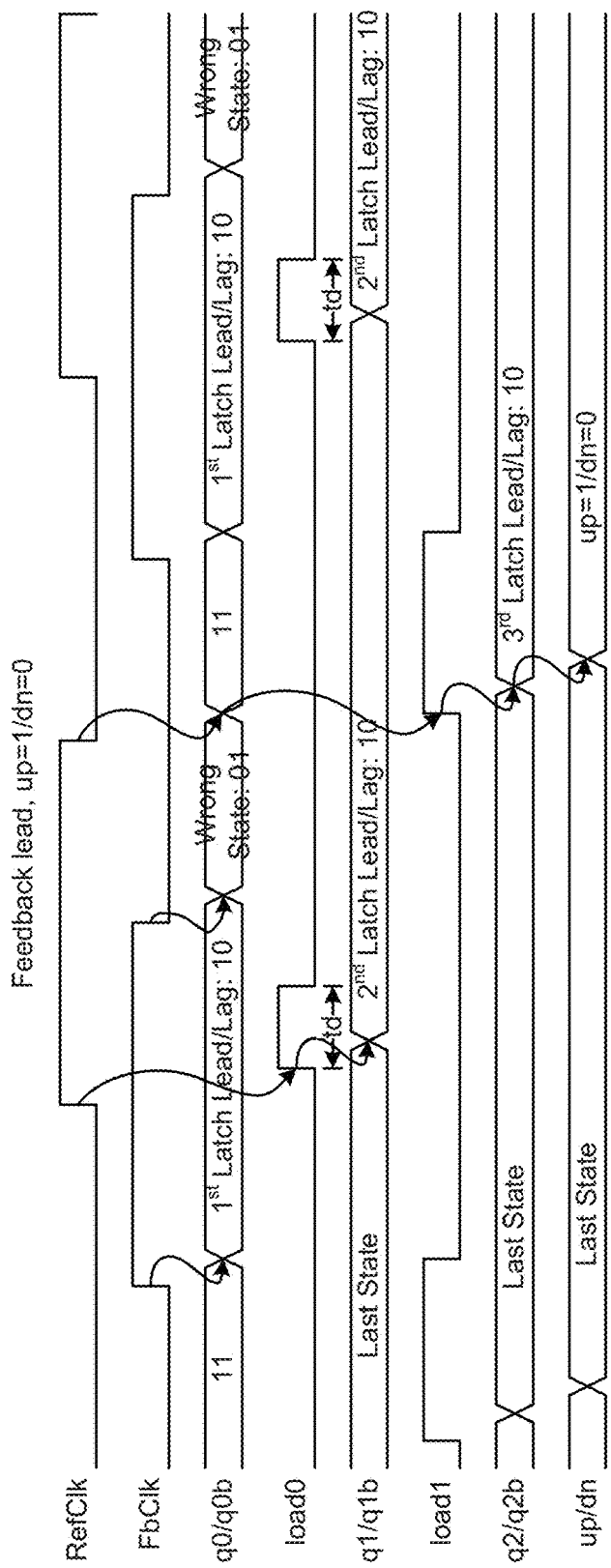
FIG. 7 illustrates feedback lead waveforms for a phase detector in accordance with an example embodiment.

FIG. 7 illustrates exemplary feedback lead waveforms for an exemplary phase detector. The feedback lead waveforms can be applicable for a feedback clock lead case, in which a DLL feedback clock (FbClk) in the phase detector leads a DLL reference clock (RefClk) in the phase detector. The feedback lead waveforms can correspond to the DLL feedback clock, the DLL reference clock, a pulse signal "load0" produced by both the reference clock and feedback clock at high states, and a pulse signal "load1" produced by the first cross coupled latch "q0/q0b" at a "11" state when both the reference clock and feedback clock at low states in the phase detector.

As shown, a first latch output "q0/q0b" of the first cross coupled latch can be set to a high (e.g., "10") state when the DLL feedback clock transits from a low to high state. When both the DLL reference clock and the DLL feedback clock are at a high state, a pulse signal "load0" can load the first latch output "q0/q0b" of the high state into the second cross coupled latch, and a second latch output "q1/q1b" can be set to a high state. When both the DLL reference clock and the DLL feedback clock are at a low state, the pulse signal "load1" can load the second latch output "q1/q1b" of the high state into a third cross coupled latch, and a third latch output "q2/q2b" can be set to a high state. Then, an up output value of '1' can be sent to a DLL state machine to increase a delay chain delay when the third latch output "q2/q2b" is set to the high state.

Figure 8:
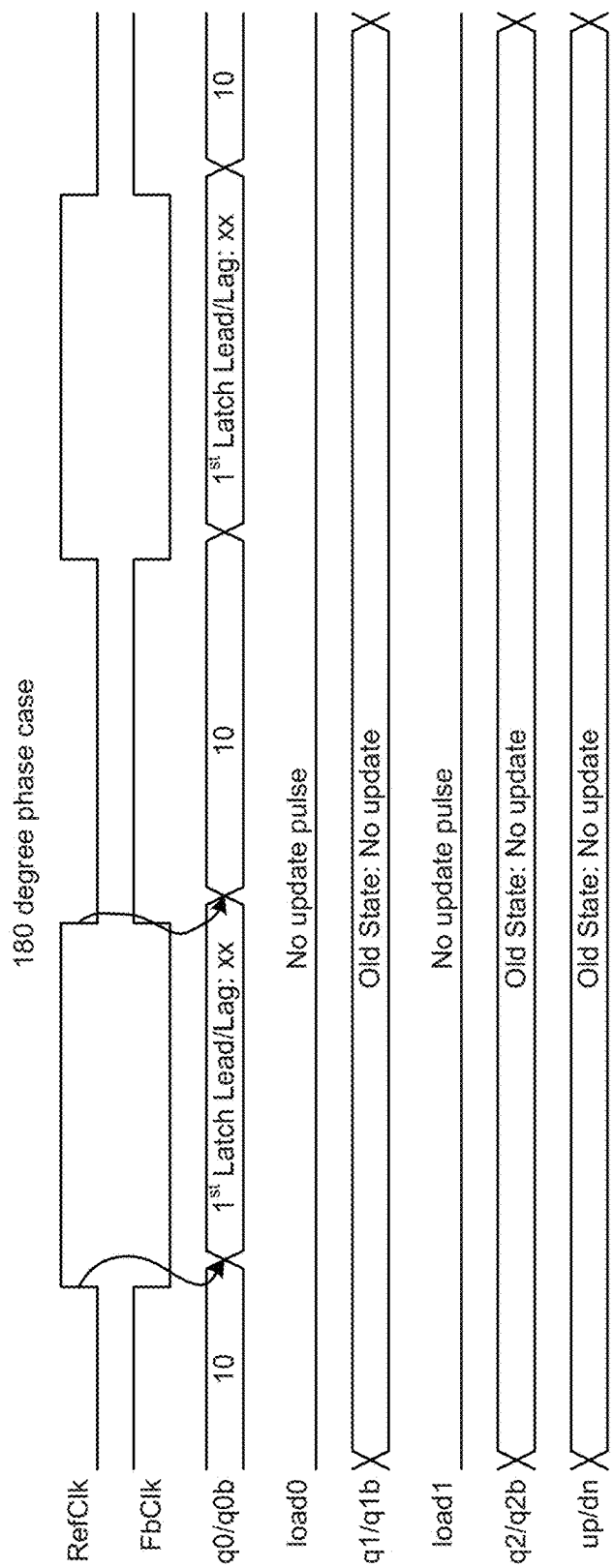
FIG. 8 illustrates operation waveforms for a phase detector in accordance with an example embodiment.

FIG. 8 illustrates exemplary operation waveforms for an exemplary phase detector. More specifically, the operation waveforms can be applicable for a 180 degree out-of-phase case, in which a DLL feedback clock (FbClk) in the phase detector and a DLL reference clock (RefClk) in the phase detector are 180 degree out-of-phase. The operation waveforms can correspond to the DLL feedback clock, the DLL reference clock, a pulse signal "load0" produced by both the reference clock and feedback clock at high states, and a pulse signal "load1" produced by the first cross coupled latch "q0/q0b" in a "11" state when both the reference clock and feedback clock are in low states in the phase detector. In this example, when the DLL feedback clock and DLL reference clock are 180 degree out-of-phase, the phase detector may not generate the pulse signal "load0" and the pulse signal "load1", such that the phase detector can hold its original state without any updates.

Figure 9:
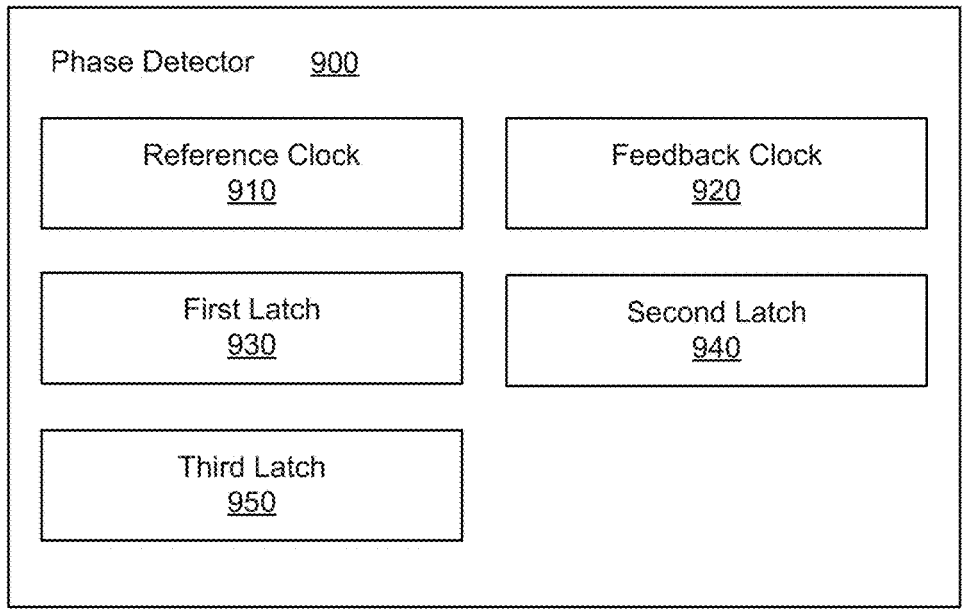
FIG. 9 illustrates a phase detector operable to perform phase detection in accordance with an example embodiment.

FIG. 9 illustrates an exemplary phase detector 900 operable to perform phase detection. The phase detector 900 can include a reference clock 910, a feedback clock 920, a first latch 930, a second latch 940 and a third latch 950. The first latch 930 can be operable to set a first latch output depending on a lead-lag status between the reference clock 910 and the feedback clock 920. The second latch 940 can load the lead-lag status when the reference clock 910 and the feedback clock 920 produce clock signals in a high state. The third latch 950 can load the lead-lag status from the second latch 940 when the reference clock 910 and the feedback clock 920 produce clock signals in a low state.

Figure 10:
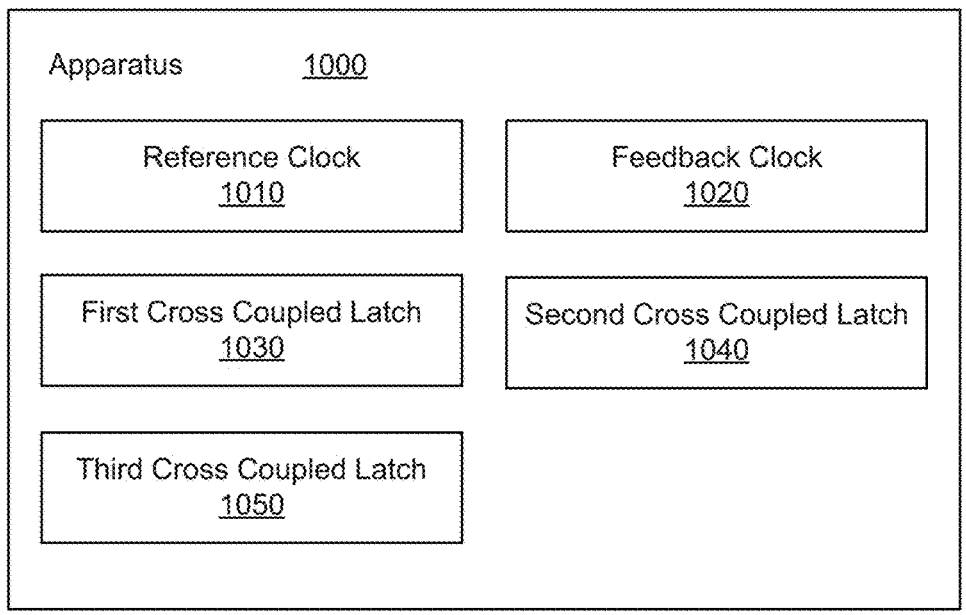
FIG. 10 illustrates an apparatus operable to perform phase detection in accordance with an example embodiment.

FIG. 10 illustrates an exemplary apparatus 1000 operable to perform digital phase detection. The apparatus 1000 can include a reference clock 1010, a feedback clock 1020, a first cross coupled latch 1030, a second cross coupled latch 1040 and a third cross coupled latch 1050. The first cross coupled latch 1030 can be operable to set a first latch output depending on a lead-lag status between the reference clock 1010 and the feedback clock 1020. The lead-lag status can indicate that the feedback clock 1020 leads the reference clock 1010 or that the feedback clock 1020 lags the reference clock 1010. The second cross coupled latch 1040 can load the lead-lag status when the reference clock 1010 and the feedback clock 1020 produce clock signals in a high state. The third cross coupled latch 1050 can load the lead-lag status from the second cross coupled latch 1040 to the third cross coupled latch 1050 when the reference clock 1010 and the feedback clock 1020 produce clock signals in a low state.

Figure 11:
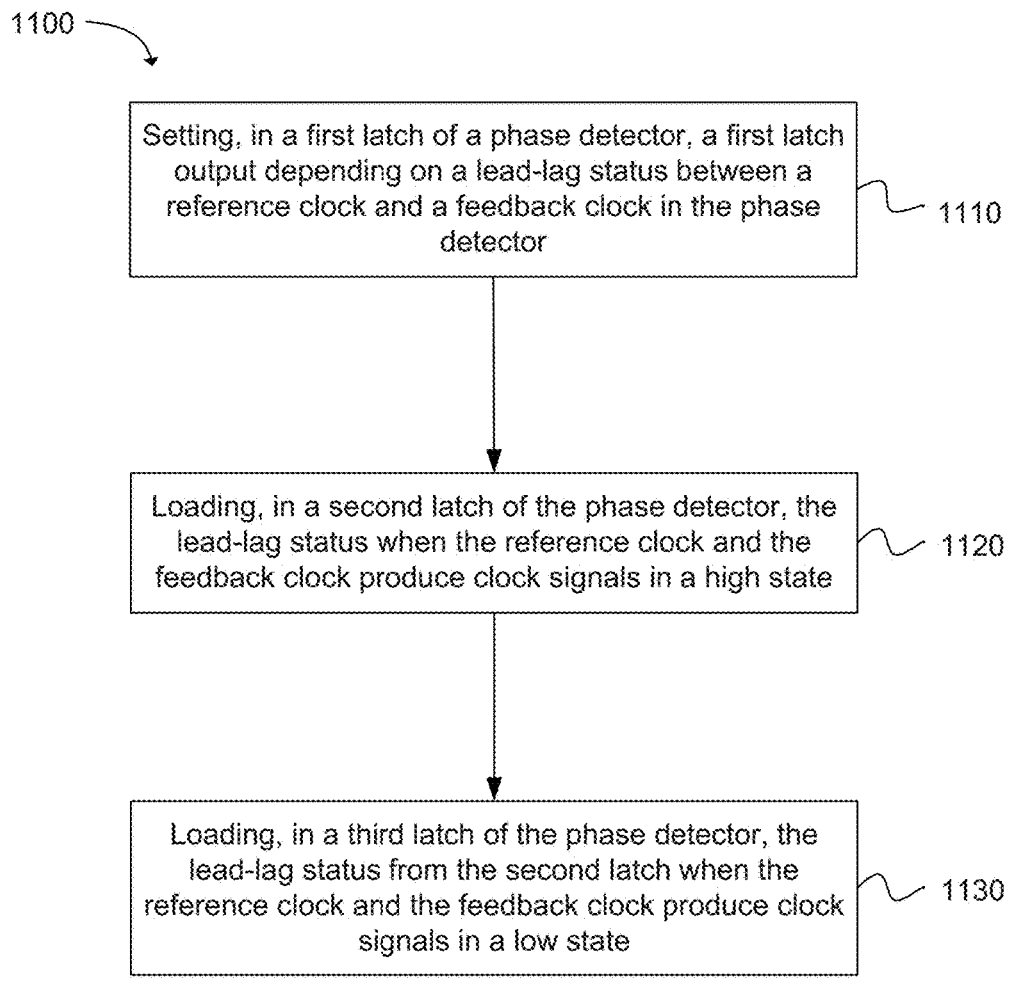
FIG. 11 depicts a flowchart of a method for performing phase detection in accordance with an example embodiment.

Another example provides a method 1100 for performing phase detection, as shown in the flow chart in FIG. 11. The method can be executed as instructions on a machine, where the instructions are included on at least one computer readable medium or at least one non-transitory machine readable storage medium. The method can include the operation of: setting, in a first latch of a phase detector, a first latch output depending on a lead-lag status between a reference clock and a feedback clock in the phase detector, as in block 1110. The method can include the operation of: loading, in a second latch of the phase detector, the lead-lag status when the reference clock and the feedback clock produce clock signals in a high state, as in block 1120. The method can include the operation of: loading, in a third latch of the phase detector, the lead-lag status from the second latch when the reference clock and the feedback clock produce clock signals in a low state, as in block 1130.

Figure 12:
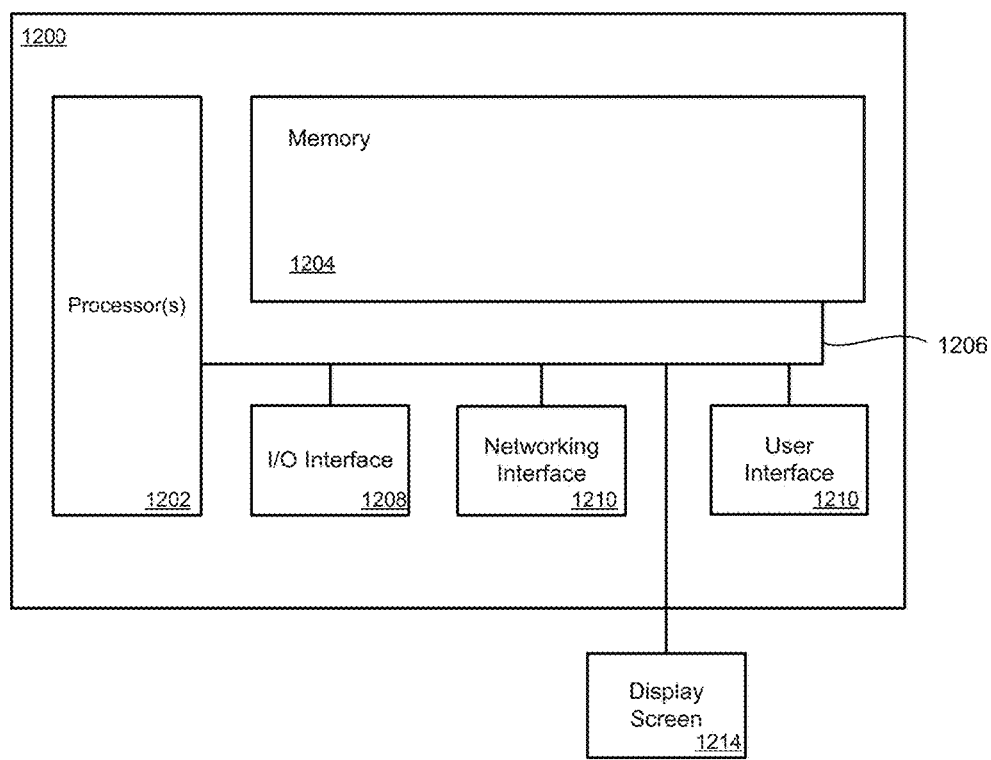
FIG. 12 illustrates a computing system that includes a data storage device in accordance with an example embodiment.

FIG. 12 illustrates a general computing system or device 1200 that can be employed in the present technology. The computing system 1200 can include a processor 1202 in communication with a memory 1204. The memory 1204 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, 3D cross point, optical media, hard-drive type media, and the like, including combinations thereof.

The computing system or device 1200 additionally includes a local communication interface 1206 for connectivity between the various components of the system. For example, the local communication interface 1206 can be a local data bus and/or any related address or control busses as may be desired.

The computing system or device 1200 can also include an I/O (input/output) interface 1208 for controlling the I/O functions of the system, as well as for I/O connectivity to devices outside of the computing system 1200. A network interface 1210 can also be included for network connectivity. The network interface 1210 can control network communications both within the system and outside of the system. The network interface can include a wired interface, a wireless interface, a Bluetooth interface, optical interface, and the like, including appropriate combinations thereof. Furthermore, the computing system 1200 can additionally include a user interface 1212, a display device 1214, as well as various other components that would be beneficial for such a system.

The processor 1202 can be a single or multiple processors, and the memory 1204 can be a single or multiple memories. The local communication interface 1206 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided a phase detector. The phrase detector can comprise a reference clock. The phrase detector can comprise a feedback clock. The phrase detector can comprise a first latch operable to set a first latch output depending on a lead-lag status between the reference clock and the feedback clock. The phrase detector can comprise a second latch that loads the lead-lag status when the reference clock and the feedback clock produce clock signals in a high state. The phrase detector can comprise a third latch that loads the lead-lag status from the second latch when the reference clock and the feedback clock produce clock signals in a low state.

In one example of the phase detector, the lead-lag status indicates that the feedback clock leads the reference clock or that the feedback clock lags the reference clock.

In one example of the phase detector, the second latch loads the lead-lag status in accordance with a defined time delay.

In one example of the phase detector, the lead-lag status indicates that the feedback clock lags the reference clock. A first latch output (q0/q0b) of the first latch is set to a low state when the reference clock produces clock signals transiting from a low state to high state. A second latch output (q1/q1b) of the second latch is set to a low state when the reference clock and the feedback clock are both in high states. A third latch output (q2/q2b) of the third latch is set to a low state when the reference clock and the feedback clock produce clock signals in low states.

In one example of the phase detector, the phase detector is configured to send a down output value of '1' to a DLL state machine to decrease a delay chain delay when the third latch output (q2/q2b) is set to the low state.

In one example of the phase detector, the lead-lag status indicates that the feedback clock leads the reference clock.

A first latch output (q0/q0b) of the first latch is set to a high state when the feedback clock produces clock signals transiting from a low state to high state. A second latch output (q1/q1b) of the second latch is set to a high state when the reference clock and the feedback clock are both in high states. A third latch output (q2/q2b) of the third latch is set to a high state when the reference clock and the feedback clock produce clock signals in low states.

In one example of the phase detector, the phase detector is configured to send an up output value of '1' to a DLL state machine to increase a delay chain delay when the third latch output (q2/q2b) is set to the high state.

In one example of the phase detector, a first signal load (load0) in the first latch becomes a self-timed high pulse when the reference clock and the feedback clock are high.

In one example of the phase detector, a first signal load (load0) in the second latch and a second signal load (load1) in the third latch do not transit to a high state when the reference clock and the feedback clock are 180 degrees out-of-phase, and the second latch and the third latch are isolated from updates to prevent incorrect toggling.

In one example of the phase detector, the first latch, the second latch and the third latch are cross coupled latches.

In one example of the phase detector, the phase detector is included in a digital delay locked loop (DLL).

In one example there is provided an apparatus. The apparatus can comprise a reference clock. The apparatus can comprise a feedback clock. The apparatus can comprise a first cross coupled latch operable to set a first latch output depending on a lead-lag status between the reference clock and the feedback clock. The lead-lag status indicates that the feedback clock leads the reference clock or that the feedback clock lags the reference clock. A second cross coupled latch that loads the lead-lag status when the reference clock and the feedback clock produce clock signals in a high state. A third cross coupled latch that loads the lead-lag status from the second cross coupled latch to the third cross coupled latch when the reference clock and the feedback clock produce clock signals in a low state.

In one example of the apparatus, the lead-lag status indicates that the feedback clock lags the reference clock. A first latch output (q0/q0b) of the first cross coupled latch is set to a low state when the reference clock produces clock signals transiting from a low state to high state. A second latch output (q1/q1b) of the second cross coupled latch is set to a low state when the reference clock and the feedback clock are both in high states. A first signal load (load0) in the first cross coupled latch loads the low state of the first latch output (q0/q0b) into the second cross coupled latch. A third latch output (q2/q2b) of the third cross coupled latch is set to a low state when the reference clock and the feedback clock produce clock signals in low states. A second signal load (load1) in the second cross coupled latch loads the low state of the second latch output (q1/q1b) into the third cross coupled latch. The phase detector is configured to send a down output value of '1' to a DLL state machine to decrease a delay chain delay when the third latch output (q2/q2b) is set to the low state.

In one example of the apparatus, the lead-lag status indicates that the feedback clock leads the reference clock. A first latch output (q0/q0b) of the first cross coupled latch is set to a high state when the feedback clock produces clock signals transiting from a low state to high state. A second latch output (q1/q1b) of the second cross coupled latch is set to a high state when the reference clock and the feedback clock are both in high states. A first signal load (load0) in the first cross coupled latch loads the high state of the first latch output (q0/q0b) into the second cross coupled latch. A third latch output (q2/q2b) of the third cross coupled latch is set to a high state when the reference clock and the feedback clock produces clock signals in low states. A second signal load (load1) in the second cross coupled latch loads the high state of the second latch output (q1/q1b) into the third cross coupled latch. The phase detector is configured to send an up output value of '1' to a DLL state machine to increase a delay chain delay when the third latch output (q2/q2b) is set to the high state.

In one example of the apparatus, a first signal load (load0) in the first cross coupled latch becomes a self-timed high pulse when the reference clock and the feedback clock are high.

In one example of the apparatus, a first signal load (load0) in the second cross coupled latch and a second signal load (load1) in the third cross coupled latch do not transit to a high state when the reference clock and the feedback clock are 180 degrees out-of-phase, and the second cross coupled latch and the third cross coupled latch are isolated from updates to prevent incorrect toggling.

In one example of the apparatus, the apparatus is a digital phase detector in a delay locked loop (DLL).

In one example there is provided a method for performing phase detection. The method can comprise: setting, in a first latch of a phase detector, a first latch output depending on a lead-lag status between a reference clock and a feedback clock in the phase detector. The method can comprise: loading, in a second latch of the phase detector, the lead-lag status when the reference clock and the feedback clock produce clock signals in high states. The method can comprise: loading, in a third latch of the phase detector, the lead-lag status from the second latch when the reference clock and the feedback clock produce clock signals in low states.

In one example of the method for performing phase detection, the method further comprises: when the lead-lag status indicates that the feedback clock lags the reference clock, setting a first latch output (q0/q0b) of the first latch to a low state when the reference clock produces clock signals transiting from a low state to high state. The method can comprise: setting a second latch output (q1/q1b) of the second latch to a low state when the reference clock and the feedback clock produce clock signals in high states. The method can comprise: setting a third latch output (q2/q2b) of the third latch to a low state when the reference clock and the feedback clock produce clock signals in low states.

In one example of the method for performing phase detection, the method further comprises: sending a down output value of '1' to a DLL state machine to decrease a delay chain delay when the third latch output (q2/q2b) is set to the low state.

In one example of the method for performing phase detection, the method further comprises: when the lead-lag status indicates that the feedback clock leads the reference clock, setting a first latch output (q0/q1b) of the first latch to a high state when the feedback clock produces clock signals transiting from a low state to high state. The method can comprise: setting a second latch output (q1/q0b) of the second latch to a high state when the reference clock and the feedback clock produce clock signals in high states. The method can comprise: setting a third latch output (q2/q2b) of the third latch to a high state when the reference clock and the feedback clock produce clock signals in low states.

In one example of the method for performing phase detection, the method further comprises: sending an up output value of '1' to a DLL state machine to increase a delay chain delay when the third latch output (q2/q2b) is set to the high state.

In one example of the method for performing phase detection, the phase detection is performed using the phase detector in a delay locked loop (DLL).

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A phase detector comprising:
   a reference clock;
   a feedback clock;
   a first latch operable to set a first latch output depending on a lead-lag status between the reference clock and the feedback clock;
   a second latch that loads the lead-lag status when the reference clock and the feedback clock produce clock signals in a high state; and
   a third latch that loads the lead-lag status from the second latch when the reference clock and the feedback clock produce clock signals in a low state.

2. The phase detector of claim 1, wherein the lead-lag status indicates that the feedback clock leads the reference clock or that the feedback clock lags the reference clock.

3. The phase detector of claim 1, wherein the second latch loads the lead-lag status in accordance with a defined time delay.

4. The phase detector of claim 1, wherein:
   the lead-lag status indicates that the feedback clock lags the reference clock, and:
   the first latch output (q0/q0b) of the first latch is set to a low state when the reference clock produces clock signals transiting from a low state to high state;
   a second latch output (q1/q1b) of the second latch is set to a low state when the reference clock and the feedback clock are both in high states; and
   a third latch output (q2/q2b) of the third latch is set to a low state when the reference clock and the feedback clock produce clock signals in low states.

5. The phase detector of claim 4, wherein the phase detector is configured to send a down output value of '1' to a delay locked loop (DLL) state machine to decrease a delay chain delay when the third latch output (q2/q2b) is set to the low state.

6. The phase detector of claim 1, wherein:
   the lead-lag status indicates that the feedback clock leads the reference clock, and:
   the first latch output (q0/q0b) of the first latch is set to a high state when the feedback clock produces clock signals transiting from a low state to high state;
   a second latch output (q1/q1b) of the second latch is set to a high state when the reference clock and the feedback clock are both in high states; and
   a third latch output (q2/q2b) of the third latch is set to a high state when the reference clock and the feedback clock produce clock signals in low states.

7. The phase detector of claim 6, wherein the phase detector is configured to send an up output value of '1' to a DLL state machine to increase a delay chain delay when the third latch output (q2/q2b) is set to the high state.

8. The phase detector of claim 1, wherein a first signal load (load0) in the first latch becomes a self-timed high pulse when the reference clock and the feedback clock are high.

9. The phase detector of claim 1, wherein a first signal load (load0) in the second latch and a second signal load (load1) in the third latch do not transit to a high state when the reference clock and the feedback clock are 180 degrees out-of-phase, and the second latch and the third latch are isolated from updates to prevent incorrect toggling.

10. The phase detector of claim 1, wherein the first latch, the second latch and the third latch are cross coupled latches.

11. The phase detector of claim 1, wherein the phase detector is included in a digital delay locked loop (DLL).

12. An apparatus comprising:
   a reference clock;
   a feedback clock;
   a first cross coupled latch operable to set a first latch output depending on a lead-lag status between the reference clock and the feedback clock, wherein the lead-lag status indicates that the feedback clock leads the reference clock or that the feedback clock lags the reference clock;
   a second cross coupled latch that loads the lead-lag status when the reference clock and the feedback clock produce clock signals in a high state; and
   a third cross coupled latch that loads the lead-lag status from the second cross coupled latch to the third cross coupled latch when the reference clock and the feedback clock produce clock signals in a low state.

13. The apparatus of claim 12, wherein:
   the lead-lag status indicates that the feedback clock lags the reference clock, and:
   the first latch output (q0/q0b) of the first cross coupled latch is set to a low state when the reference clock produces clock signals transiting from a low state to high state;
   a second latch output (q1/q1b) of the second cross coupled latch is set to a low state when the reference clock and the feedback clock are both in high states, wherein a first signal load (load0) in the first cross coupled latch loads the low state of the first latch output (q0/q0b) into the second cross coupled latch; and
   a third latch output (q2/q2b) of the third cross coupled latch is set to a low state when the reference clock and the feedback clock produce clock signals in low states, wherein a second signal load (load1) in the second cross coupled latch loads the low state of the second latch output (q1/q1b) into the third cross coupled latch,
   wherein the phase detector is configured to send a down output value of '1' to a delay locked loop (DLL) state machine to decrease a delay chain delay when the third latch output (q2/q2b) is set to the low state.

14. The apparatus of claim 12, wherein:
   the lead-lag status indicates that the feedback clock leads the reference clock, and:
   the first latch output (q0/q0b) of the first cross coupled latch is set to a high state when the feedback clock produces clock signals transiting from a low state to high state;
   a second latch output (q1/q1b) of the second cross coupled latch is set to a high state when the reference clock and the feedback clock are both in high states, wherein a first signal load (load0) in the first cross coupled latch loads the high state of the first latch output (q0/q0b) into the second cross coupled latch; and a third latch output (q2/q2b) of the third cross coupled latch is set to a high state when the reference clock and the feedback clock produces clock signals in low states, wherein a second signal load (load1) in the second cross coupled latch loads the high state of the second latch output (q1/q1b) into the third cross coupled latch, wherein the phase detector is configured to send an up output value of '1' to a delay locked loop (DLL) state machine to increase a delay chain delay when the third latch output (q2/q2b) is set to the high state.

15. The apparatus of claim 12, wherein a first signal load (load0) in the first cross coupled latch becomes a self-timed high pulse when the reference clock and the feedback clock are high.

16. The apparatus of claim 12, wherein a first signal load (load0) in the second cross coupled latch and a second signal load (load1) in the third cross coupled latch do not transit to a high state when the reference clock and the feedback clock are 180 degrees out-of-phase, and the second cross coupled latch and the third cross coupled latch are isolated from updates to prevent incorrect toggling.

17. The apparatus of claim 12, wherein the apparatus is a digital phase detector in a delay locked loop (DLL).

18. A method for performing phase detection, the method comprising:
setting, in a first latch of a phase detector, a first latch output depending on a lead-lag status between a reference clock and a feedback clock in the phase detector;
loading, in a second latch of the phase detector, the lead-lag status when the reference clock and the feedback clock produce clock signals in high states; and
loading, in a third latch of the phase detector, the lead-lag status from the second latch when the reference clock and the feedback clock produce clock signals in low states.

19. The method of claim 18, further comprising:
when the lead-lag status indicates that the feedback clock lags the reference clock:
setting the first latch output (q0/q0b) of the first latch to a low state when the reference clock produces clock signals transiting from a low state to high state;
setting a second latch output (q1/q1b) of the second latch to a low state when the reference clock and the feedback clock produce clock signals in high states; and
setting a third latch output (q2/q2b) of the third latch to a low state when the reference clock and the feedback clock produce clock signals in low states.

20. The method of claim 19, further comprising sending a down output value of '1' to a delay locked loop (DLL) state machine to decrease a delay chain delay when the third latch output (q2/q2b) is set to the low state.

21. The method of claim 18, further comprising:
when the lead-lag status indicates that the feedback clock leads the reference clock:
setting the first latch output (q0/q0b) of the first latch to a high state when the feedback clock produces clock signals transiting from a low state to high state;
setting a second latch output (q1/q1b) of the second latch to a high state when the reference clock and the feedback clock produce clock signals in high states; and
setting a third latch output (q2/q2b) of the third latch to a high state when the reference clock and the feedback clock produce clock signals in low states.

22. The method of claim 21, further comprising sending an up output value of '1' to a delay locked loop (DLL) state machine to increase a delay chain delay when the third latch output (q2/q2b) is set to the high state.

23. The method of claim 18, wherein the phase detection is performed using the phase detector in a delay locked loop (DLL).

* * * * *